United States Patent [19]
Ono et al.

[11] Patent Number: 5,510,792
[45] Date of Patent: Apr. 23, 1996

[54] ANECHOIC CHAMBER AND WAVE ABSORBER

[75] Inventors: Nobuyuki Ono; Yoshihisa Hayashi; Atsushi Kisuki; Yasushi Ikeda, all of Tokyo, Japan

[73] Assignee: TDK Corporation, Tokyo, Japan

[21] Appl. No.: 363,918

[22] Filed: Dec. 27, 1994

[30] Foreign Application Priority Data

Dec. 27, 1993 [JP] Japan ................................ 5-073707 U
Jun. 23, 1994 [JP] Japan .................................. 6-163331

[51] Int. Cl.⁶ .................................................. H01Q 17/00
[52] U.S. Cl. ........................................................ 342/4; 342/1
[58] Field of Search ...................................... 342/1, 2, 3, 4

[56] References Cited

U.S. PATENT DOCUMENTS

| | | | |
|---|---|---|---|
| 2,599,944 | 6/1952 | Salisbury | 342/1 |
| 3,315,260 | 4/1967 | Wesch | 342/3 |
| 3,454,947 | 7/1969 | Wesch et al. | 342/1 |
| 3,737,903 | 6/1973 | Suetake et al. | 342/1 |
| 3,887,920 | 6/1975 | Wright et al. | 342/1 |
| 4,118,704 | 10/1978 | Ishino et al. | 342/4 |
| 4,972,191 | 11/1990 | Ishino et al. | |
| 5,134,405 | 7/1992 | Ishihara et al. | 342/1 |
| 5,323,160 | 6/1994 | Kim et al. | 342/1 |

Primary Examiner—Charles T. Jordan
Assistant Examiner—Theresa M. Wesson
Attorney, Agent, or Firm—Oblon, Spivak, McClelland, Maier & Neustadt

[57] ABSTRACT

An anechoic chamber has a structure in which a dielectric plate is interposed between an electromagnetic shielding metal plate provided on an interior surface of the chamber and ferrite tiles serving as wave absorbing members, such that the ferrite tiles are located on an interior-side surface of the chamber. Screws serving as metal fittings are secured onto the electromagnetic shielding metal plate, and the dielectric plate is reliably attached to the metal plate by making use of the screws. Alternatively, the dielectric plates are attached to the steel sheet by means of adhesive such that the dimensions of each dielectric plate is made sufficiently smaller than those of a fixed size.

12 Claims, 7 Drawing Sheets

ANECHOIC CHAMBER AND WAVE ABSORBER

BACKGROUND OF THE INVENTION

The present invention relates to an anechoic chamber which is used in the measurement of the radiation noise field strength of equipment that generates radio noise causing radio interference to other equipment, and is used in cases where malfunctioning is tested by radiating radio waves of a high electromagnetic field to electronic apparatuses. More particularly, the present invention concerns an anechoic chamber in which the entire chamber is provided with electromagnetic shielding by metal plates, and which uses a multilayered wave absorber in which a structural member having a dielectric material provided on the rear surface of a wave absorbing member, such as a ferrite, is disposed on each metal plate.

A conventional multilayered wave absorber is disclosed in U.S. Pat. No. 4,972,191, wherein a ferrite is provided on an outermost surface facing oncoming radio waves, a dielectric material is provided on the entire rear surface of the ferrite, and a wave reflector is provided on the entire rear surface of the dielectric material.

The attachment of such a multilayered wave absorber to an interior surface of an anechoic chamber is generally effected by the use of an adhesive.

In the anechoic chamber which is required to have an electromagnetic shielding performance, as for the wave reflector which is a constituting element of the multilayered wave absorber, there are cases where the wave reflector is also used as a shielding material covering the entire chamber, and cases where the wave reflector is installed in a separated form on the chamber interior-side surface of the shielding material. Metal plates are generally used as the shielding material and the wave reflector.

In attaching the dielectric material to the wave reflector and attaching the ferrite to the dielectric material, an epoxy resin adhesive is generally used in the light of reliability. The distance between the rear surface of the ferrite and the surface of the wave reflector and both the types of material and thickness of the dielectric material and adhesive located therebetween constitute factors affecting the wave absorbing characteristic.

In addition, the ferrite of the multilayered wave absorber has a thickness of several millimeters in the light of its characteristic, and is in the form of a tile with longitudinal and transverse dimensions of 100 mm or thereabouts. Each tile of this ferrite is attached to the dielectric material at a site by using an adhesive.

As the electromagnetic shielding member serving as the wave reflector, the following structures are generally used: a structure in which thin iron sheets each having a thickness of 1 mm or less are plated, and the iron sheets are joined by soldering, a structure in which iron sheets each having a thickness of 1 mm or more are used, and the iron sheets are welded and are shield-joined, and a structure in which panels are formed by iron plates and shield-joined by metal fasteners.

When the anechoic chamber is constructed by using the multilayered wave absorber as described above, there are problems which are described below.

Even if a highly reliable adhesive is used in attaching the dielectric material, there is a possibility that an exfoliation may occur between the dielectric material and the wave reflector due to inadequate handling of the adhesive at the site or deterioration with age in the light of durability, resulting in the detachment of the dielectric material. A special plywood having a relatively large size with a longitudinal dimension of 1800mm and a transverse dimension of 900 mm may be used as the dielectric material.

As the dielectric plate which is attached to the electromagnetic shielding member serving as the wave reflector, special plywood having a thickness of 10 mm or thereabouts is used, and, as for the size of the plywood, the efficiency of execution of work is considered to be good if the plywood is used in a so-called standard 3×6 feet size (910 mm ×1820 mm), a 4×8-feet size (1210 mm ×2420mm), or a metric size (1000 mm ×2000 mm) as it is.

In attaching the dielectric plate, the distance between the chamber interior-side surface of the shielding member and the dielectric plate needs to be set to an appropriate design value for obtaining the wave absorbing characteristic. If the dielectric plate is standard-sized, there are cases where a warp of the plate is 3 mm to 10 mm or more, and the thickness of an applied coat of the adhesive is 3 mm to 5 mm to ensure that the distance between the chamber interior-side surface of the shielding member and the dielectric plate is set to the design value. As a result, if the warp of the plate is large, there are cases where portions which are not bonded to the shielding member appear, causing the exfoliation of the dielectric plate.

To overcome the problems of faulty bonding and exfoliation which are ascribable to such warping of the dielectric plate, it is necessary to provide support which is called "temporary fixing" at a multiplicity of points until the adhesive is cured. Hence, there are problems in that time and trouble are required for the on-site execution of work, and that skilled operators are required.

The thickness (interval) between the rear surface of the ferrite and the surface of the wave reflector is determined by not only the thickness of the dielectric material but the thickness of the adhesive layer, so that ample care is needed in the amount of the adhesive applied, the applying method, and in the method of supporting the dielectric material. If the thickness of the adhesive layer exceeds an allowable range, there is a possibility of deterioration of the wave absorbing characteristic.

In addition to the method of the above in which the dielectric plate is bonded to the electromagnetic shielding member while supporting the dielectric plate by temporary fixing, a method is also commonly practiced in which the dielectric plate is attached by the sole use of metal fittings such as screws or by the joint use of metal fittings and an adhesive. However, a large number of screws or the like are required to overcome the problem of faulty bonding (the occurrence of portions which are not bonded to the shielding member) due to the warping of the standard-sized dielectric plate. In this case, a special measure is needed to attach the metal fittings such as screws to the shielding member. If the number of metal fittings such as screws becomes large, there is a problem in that the efficiency of execution of work declines, resulting in higher costs. In particular, in the case of the aforementioned shielded structure using thin iron sheets, each having a thickness of 1 mm or less, the problem becomes serious.

Furthermore, if the metal fittings such as screws are passed through the shielding member without taking an appropriate measure, there is the problem of deterioration of the electromagnetic shielding performance due to wave leakage through the gap between the metal fitting and the shielding material. For example, in the case of 1 mm gap, the shielding characteristic is deteriorated about 20 dB at 100MHz, and about 30 to 40 dB at 1000MHz.

There are problems in that the on-site execution time becomes prolonged since the ferrite is attached to the surface of the dielectric material at the site, and that operators who have a high level of skill are required for controlling the thickness of the adhesive.

If the ferrite wave absorbing members are attached to the standard-sized dielectric plate to form a wave absorber panel, and this wave absorber panel is attached to the electromagnetic shielding member, the weight of the wave absorber panel becomes 50 to 60 kg/panel, so that various problems arise in handling.

SUMMARY OF THE INVENTION

In view of the above-described problems, the object of the present invention is to provide an anechoic chamber which makes it possible to reliably attach the dielectric plate to the metal plate used as the wave reflector and serving also as the shielding material, and which makes it possible to reduce the on-site execution time and does not require skilled operators by improving the operating efficiency during assembly, by attaching in advance a wave absorbing member, such as ferrite, to the front surface of the dielectric plate.

To attain the above object, according to the first aspect of the invention, in an arrangement in which a dielectric plate is interposed between a metal plate at an interior surface of the chamber and a wave absorbing member such that the wave absorbing member is located on an interior-side surface of the chamber. Furthermore, metal fittings are welded or brazed onto the metal plate, and that the dielectric plate is attached to the metal plate by means of the metal fittings.

In addition, an adhesive may be used jointly in attaching the dielectric plate to the metal plate.

Furthermore, a ferrite tile may be used as the wave absorbing member, and a plurality of the ferrite tiles may be attached to a chamber interior-side surface of the dielectric plate so as to form a wave absorbing panel.

To attain the above object, according to the second aspect of the invention, in an arrangement in which an electromagnetic shielding member is used as a wave reflector, a dielectric plate is disposed on the electromagnetic shielding member, and wave absorbing members are disposed on a chamber interior-side surface of the dielectric plate, the anechoic chamber in accordance with the present invention is characterized in that dimensions of the dielectric plate are made sufficiently smaller than those of a standard size. The dimension of a side is set in a range from 100 to 1000 mm, preferably in a range from 300 to 800 mm. More desirably, the dielectric plate is set as a 500 to 600 mm square. The dielectric plate is bonded to the electromagnetic shielding member.

In addition, an arrangement may be provided such that the wave absorbing members are attached in advance to the dielectric plate whose dimensions are made sufficiently smaller than those of the normal standard size so as to form a wave absorber panel, and the wave absorber panel may be bonded to the electromagnetic shielding member at a site.

In the anechoic chamber of the first aspect of the present invention, attachment is made possible by means of metal fittings (studs having threaded portions, studs having retaining heads, or the like) such as screws and nuts instead of attaching the dielectric plate to the metal plate only by an adhesive. Hence, the attachment of the dielectric plate can be executed speedily and reliably.

In addition, since the metal fittings are securely attached to the metal plate by welding or brazing, holes provided through the metal plate are not bored. For this reason, the problem due to the leakage of radio waves does not occur.

Furthermore, in cases where the metal fittings are those having threaded portions such as screws, it is possible to control at least the distance between the surface of the dielectric material and the surface of the metal plate when the dielectric plate is attached.

Moreover, prior to the on-site execution of work, the wave absorbing member, such as a ferrite, can be attached in advance to the front surface of the dielectric plate so as to form a panel block.

In the anechoic chamber of the second aspect of the present invention, since the dimensions of the dielectric plate attached to the electromagnetic shielding member by an adhesive are made sufficiently smaller than those of a standard size, it is possible to overcome faulty bonding ascribable to the warping or the like of the dielectric plate. In addition, the weight per dielectric plate can be made light, thereby facilitating the execution of work at a site of operation. Specifically, the advantages are as follows.

The size of the warp can be minimized sufficiently as compared to the magnitude of the warp per plate in the case where the dielectric plate is standard-sized. Accordingly, it is possible to prevent the occurrence of faulty bonding such as the occurrence of portions which are not bonded to the dielectric plate.

It is possible to obtain uniformity in the thickness of the applied coat of the adhesive per dielectric plate. Accordingly, the interval between the chamber interior-side surface of the electromagnetic shielding member and the dielectric plate can be set to an appropriate design value for obtaining a good wave absorbing characteristic.

The weight of the wave absorber panel which is formed by attaching ferrite wave absorbing members to the dielectric plate can be set to not more than 20 kg/plate, which facilitates handling. Consequently, the efficiency of the on-site execution of work can be improved.

Although temporary fixing is required until the adhesive is cured when the dielectric plate is attached to the electromagnetic shielding member by the adhesive, since the area of the dielectric plate is made small, the number of supporting points per dielectric plate is reduced. Hence, the temporarily fixing operation is facilitated as compared to the case of a standard-sized dielectric plate, so that the execution of work is facilitated even if the number of operators is small.

DETAILED DESCRIPTION OF PREFERRED EMBODIMENTS

Figure 1:
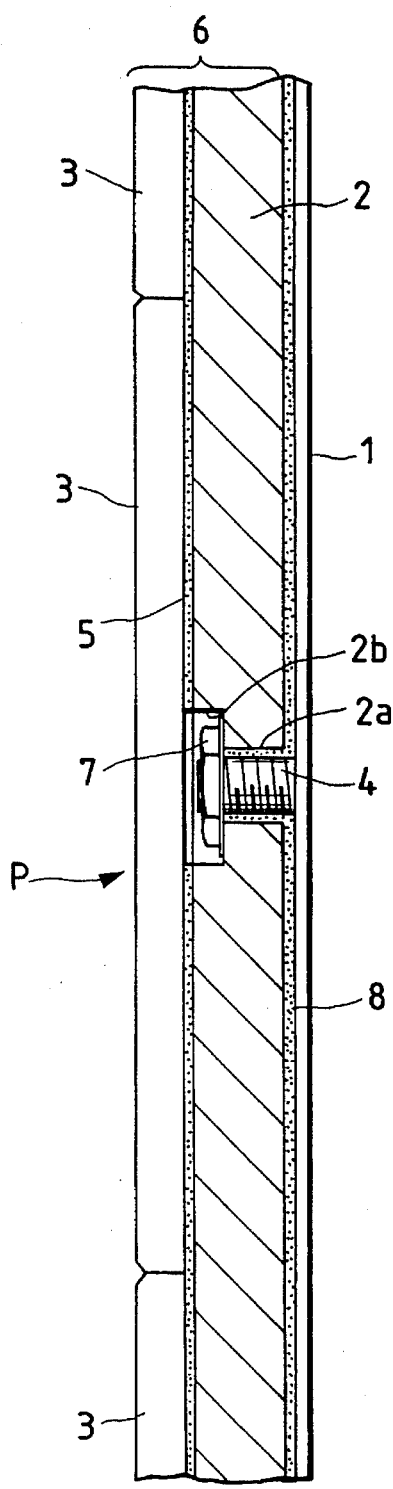
FIG. 1 is a side cross-sectional view of a wall portion of an anechoic chamber and illustrates a first embodiment of the anechoic chamber in accordance with the present invention.

Referring now to the drawings, a description will be given of the embodiments of the anechoic chamber in accordance with the present invention.

A first embodiment of the present invention will be described with reference to FIGS. 1 to 7. FIG. 1 is a side cross section of a wall portion of the anechoic chamber in the first embodiment, and FIGS. 2 to 7 are diagrams explaining the procedure of construction of the anechoic chamber. In the drawings, reference numeral 1 denotes an electromagnetic shielding metal plate, the electromagnetic shielding metal plates 1 being attached to the entire interior surfaces of an outer-shell structure; numeral 2 denotes a dielectric plate such as special plywood; and numeral 3 denotes a ferrite tile serving as a wave absorbing member, the ferrite tile 3 being disposed in such a manner as to be located on a chamber interior-side outermost surface (an outermost surface facing oncoming radio waves).

The electromagnetic shielding metal plate 1 is used as both the electromagnetic shielding material and a wave reflector, and electromagnetically shields the entire chamber of the outer-shell structure which is to form the anechoic chamber (i.e., shields the entire chamber so that electromagnetic waves do not leak or enter). This electromagnetic shielding metal plate 1 is formed of, for example, a galvanized steel plate, and other types of steel plate, a stainless steel plate, a copper plate, a brass plate, or an aluminum plate, and must be a material to which metal fittings can be secured by welding or brazing, as will be described later (it may be either an electromagnetic shielding material having a magnetic shielding effect, such as a steel product, or an electric shielding material of a nonmagnetic material, such as copper, brass, or aluminum).

Figure 2:
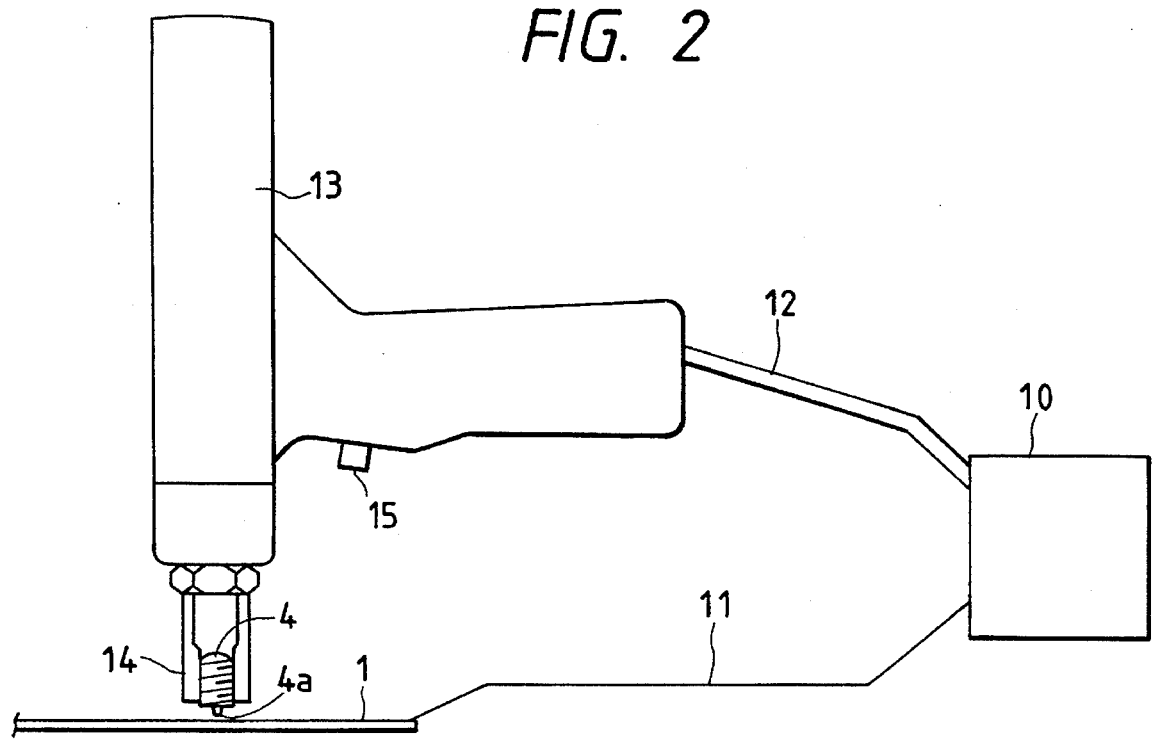
FIG. 2 is an explanatory diagram illustrating a step of welding a screw onto an electromagnetic shielding metal plate in the first embodiment.
Figure 3:
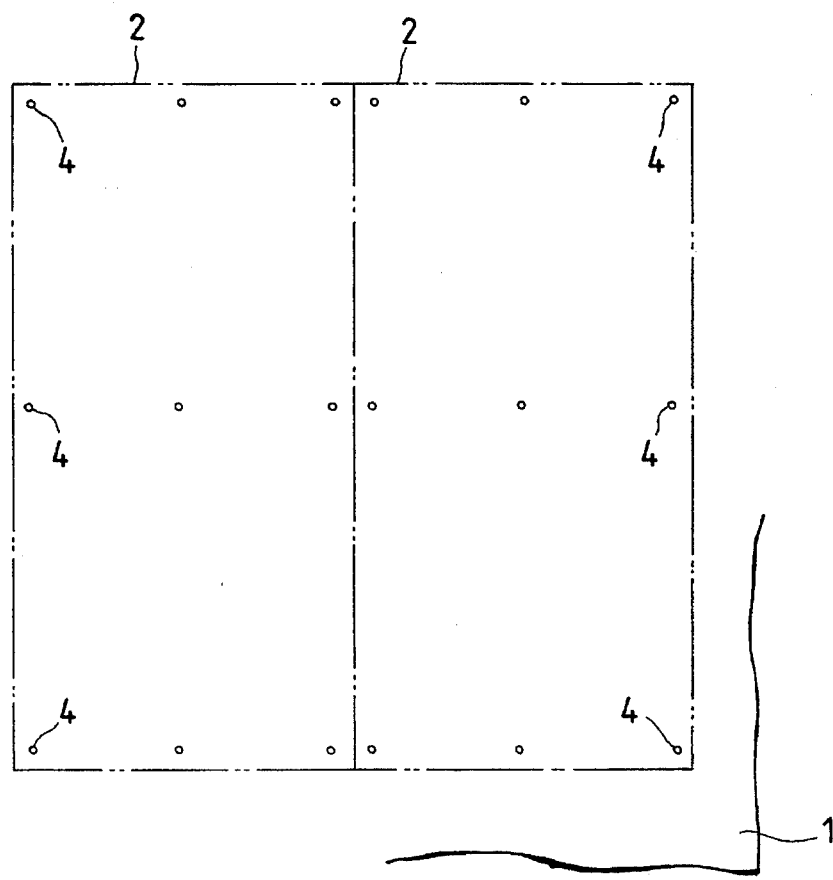
FIG. 3 is a front elevational view illustrating a state in which a multiplicity of screws for attaching a dielectric plate are welded onto the electromagnetic shielding metal plate in the first embodiment.

First, as shown in FIG. 2, screws (male screws) 4, i.e., metal fittings for attaching the dielectric plate 2 shown in FIG. 1, are welded onto the electromagnetic shielding metal plate 1 by a stud welding machine (a condenser-discharge welding machine suitable for the welding of small metallic parts) 10. That is, after the electromagnetic shielding metal plate 1 is connected in advance to the ground side of the welding machine 10 by a ground wire 11, the screw 4 having a small welding projection 4a at its bottom is held, prior to welding, by a chuck 14 of a welding gun body 13 connected to the welding machine 10 by a power supply line 12, and the small welding projection 4a is made to abut against the electromagnetic shielding metal plate 1. If a trigger 15 of the welding gun body 13 is pulled in this state, the electricity accumulated in a condenser within the welding machine 10 is instantaneously discharged to generate an arc between the small projection 4a and the electromagnetic shielding metal plate 1, thereby making it possible to fixedly secure the bottom of the screw 4 to the electromagnetic shielding metal plate 1 by welding in a short time.

Such attachment of the screws 4 may be executed after the attachment of the electromagnetic shielding metal plates 1 to the interior surfaces of the outer-shell structure which is to form the anechoic chamber, or may be executed in advance prior to the attachment thereof. As shown FIG. 3, as for the arrangement of the screws 4 welded onto the electromagnetic shielding metal plate 1, the positions of the screws 4 are made to correspond to the positions of attaching holes (nine attaching holes are provided in one dielectric plate) in the dielectric plate 2, which will be described later.

Figure 4:
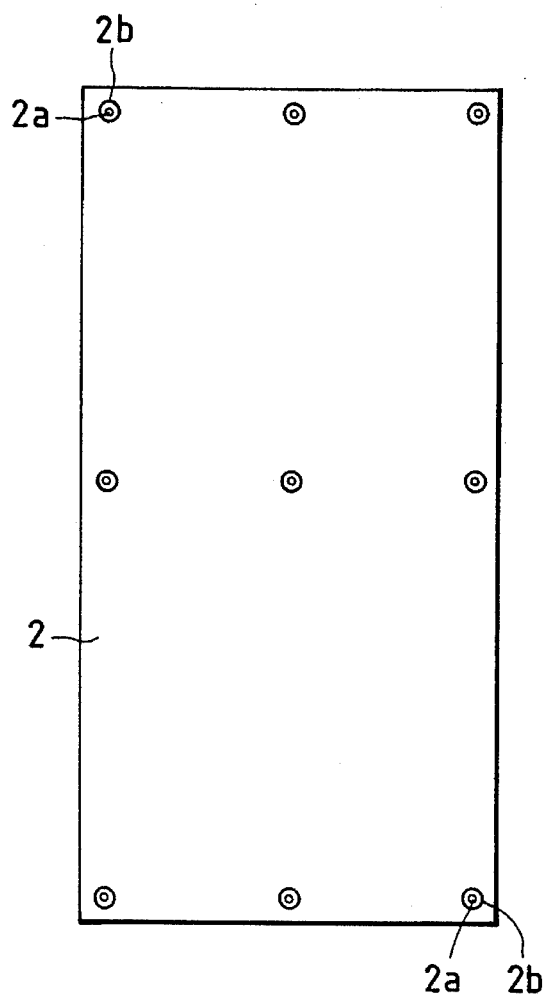
FIG. 4 is a front elevational view illustrating the dielectric plate having attaching holes corresponding to the screws on the electromagnetic shielding metal plate side in the first embodiment.

As shown in FIG. 4, the dielectric plate 2 is constituted by special plywood of a standard size with a longitudinal dimension of 1800 mm, a transverse dimension of 900 mm, and a thickness of 9 mm or thereabouts, for example. The thickness of the dielectric plate 2 is determined in a range from 3 to 15 mm, preferably in a range from 5 to 10mm, in accordance with waves to be absorbed or design requirements. Further, in the structure of the multilayered wave absorber, the distance between the surface of the shielding metal plate and the back surface of the ferrite is set in a range from 5 to 20 mm, preferably from 8 to 16 mm. More desirably, the distance is set about 14 to 15 mm. The dielectric plate 2 has attaching holes 2a corresponding to the positions of the screws 4 and recesses 2b each surrounding the attaching hole (the recess 2b being a surface lower than the upper surface of the dielectric plate and having a diameter larger than that of the attaching hole). Here, an example is shown in which one dielectric plate 2 is screwed at nine locations. The recess 2b is provided to ensure that a distal end of the screw 4 and a flanged nut 7 which is threadedly engaged therewith do not project from the front surface of the dielectric plate 2.

Figure 6:
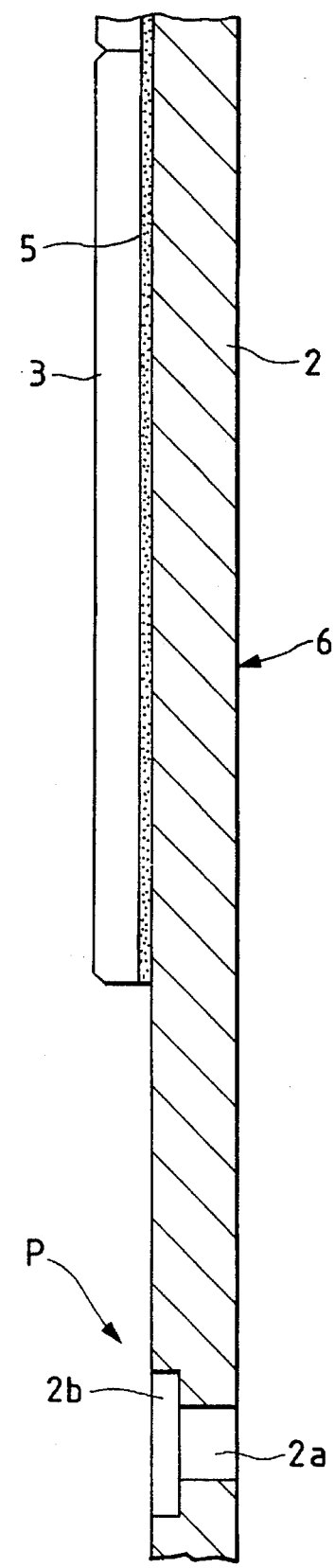
FIG. 6 is a side cross-sectional view illustrating an arrangement of the wave absorber panel.
Figure 5:
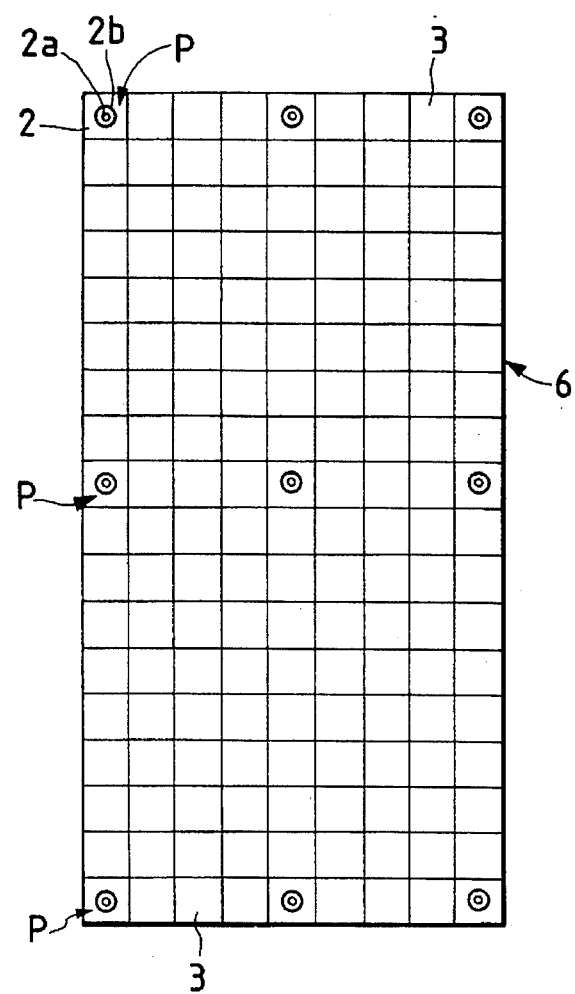
FIG. 5 is a front elevational view illustrating a state in which a wave absorbing panel is formed by attaching ferrite tiles to the front surface of the dielectric plate in the first embodiment.

As shown in FIG. 4, the ferrite tiles 3 formed of an Ni—Zn ferrite having a large magnetic permeability are bonded in advance to the front surface (upper surface) of the dielectric plate 2 in which the attaching holes 2a and the recesses 2b are formed, as shown in FIGS. 5 and 6. Thus, a wave absorber panel 6 is formed in which the ferrite tiles 3 are attached to the front surface of the dielectric plate 2 (the dielectric plate 2 is disposed at the back of the ferrite tiles 3). Generally, the ferrite tile 3 is 100 mm square and has a thickness of several millimeters or thereabouts. An epoxy resin adhesive for tiles is used as the adhesive 5. However, the ferrite tile at a portion P for covering the attaching hole 2a and the recess 2b is left unattached since the flanged nut 7 is threadedly engaged with the screw 4 in a later step, as shown in FIG. 1.

Figure 7:
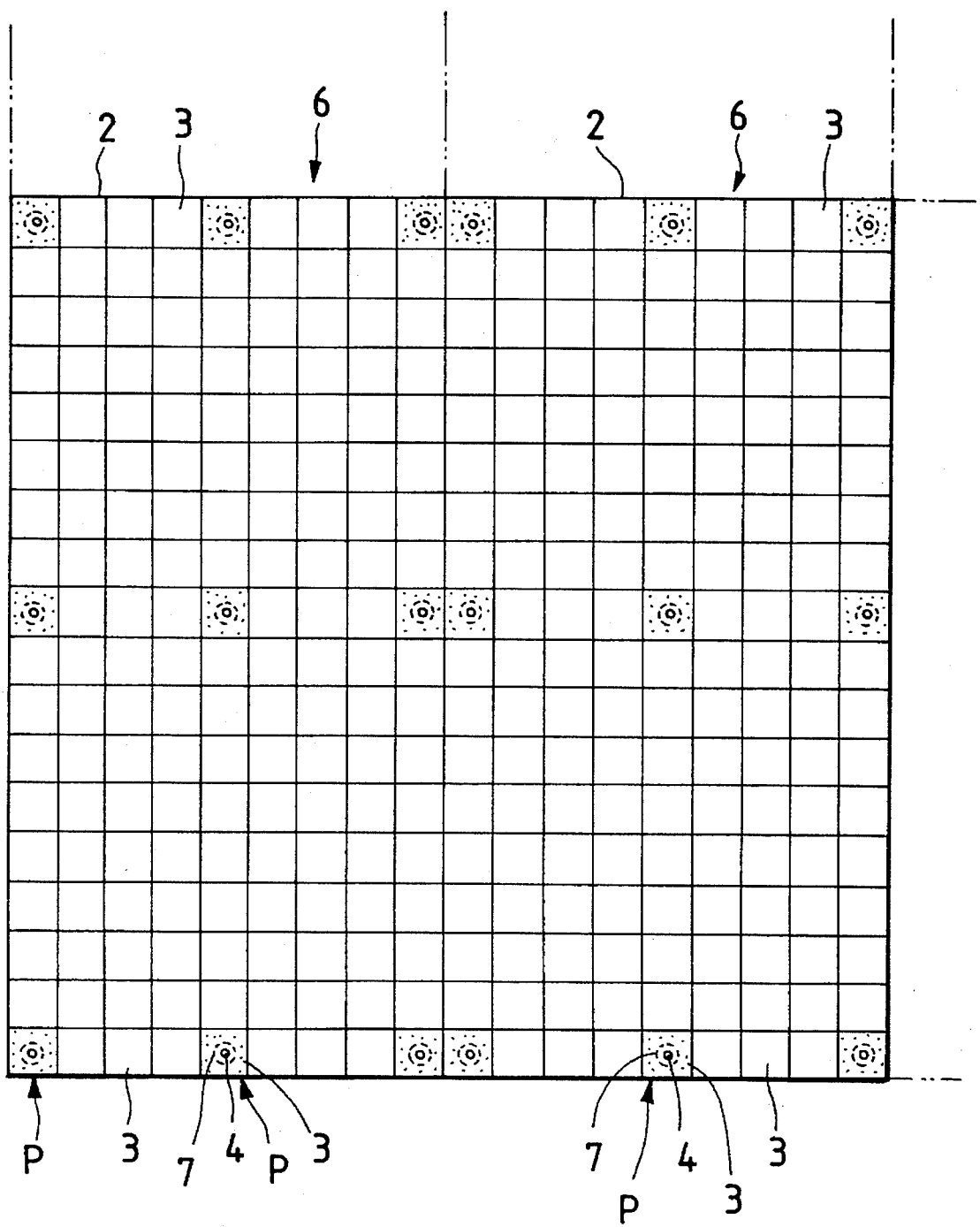
FIG. 7 is a front elevational view illustrating a state in which the attachment of the wave absorber panel is completed in the first embodiment.

As shown in FIGS. 1 and 7, the wave absorber panel 6, in which the ferrite tiles 3 are disposed on the front surface of the dielectric plate 2, is secured to the electromagnetic shielding metal plate 1 attached to the interior surface of the outer-shell structure, by fitting the screws 4 in the respective attaching holes 2a provided in the dielectric plate 2, and by threadedly engaging and tightening the flanged nuts 7 on the respective screws 4. At that juncture, an adhesive 8 is applied between the dielectric plate 2 and the electromagnetic shielding metal plate 1, and the bonding of the two members is effected simultaneously. After the nuts 7 are fitted, by using the adhesive 5, the ferrite tiles 3 are bonded to the portions P for covering the attaching holes 2a and the recesses 2b to which the ferrite tiles 3 have not been fitted. Incidentally, the adhesive 8 is an epoxy resin adhesive similar to the adhesive 5. The reason why the flanged nuts are used as the nuts 7 is to increase the area for holding the dielectric plate 2 which is plywood, but ordinary nuts and washers may be combined.

The electromagnetic shielding metal plates 1 are provided on the entire interior-side surfaces of the outer-shell structure, i.e., the four side surfaces, the ceiling surface, and the floor surface. The wave absorber panels 6 are disposed on at least the four side surfaces and the ceiling surface, and may be disposed on the floor surface, as required.

In accordance with the above-described first embodiment, it is possible to obtain the following advantages.

(1) The electromagnetic shielding metal plate 1 is capable of serving as both the wave reflector and the shielding material for shielding electromagnetic waves from leaking or entering, so that the structure can be simplified and a reduction in cost can be attained.

(2) The wave absorber panel 6 in which the ferrite tiles 3 are attached to the front surface of the dielectric plate 2, such as special plywood, can be secured to the electromagnetic shielding metal plate 1 by means of the screws 4 and the nuts 7. This eliminates the danger Of the falling of the wave absorber panel 6 due to the exfoliation of the adhesive.

(3) Since the wave absorber panel 6 can be secured to the electromagnetic shielding metal plate 1 by means of the screws 4 and the nuts 7, it is unnecessary to support the wave absorber panel 6 until the adhesive 8 is cured. Hence, the time and trouble required for execution of work can be saved.

(4) Since the dielectric plate 2, such as plywood, can be attached by means of the screws 4, the interval between the surface of the dielectric material and the electromagnetic shielding metal plate 1 serving as the wave reflector can be controlled. Hence, the initially designed characteristics of the anechoic chamber can be maintained.

(5) The screws 4 are secured (welded or brazed) onto the electromagnetic shielding metal plate 1 by welding or brazing, so that there is no decline in the electromagnetic shielding performance which can otherwise occur if the screws are passed through the electromagnetic shielding metal plate 1.

(6) Since joint use is made of the attachment of the wave absorber panel 6 by means of the screws 4 and the nuts 7 and the bonding of the wave absorber panel 6 by the adhesive 8, reliable and durable attachment is possible.

(7) Since the ferrite tiles 3 and the dielectric plate 2, which constitute the multilayered wave absorber, can be formed in advance into a panel block (can be formed as the wave absorber panel 6), advantages are offered in that it is possible to reduce the on-site execution time and operators having a high level of skill are not required.

Figure 8:
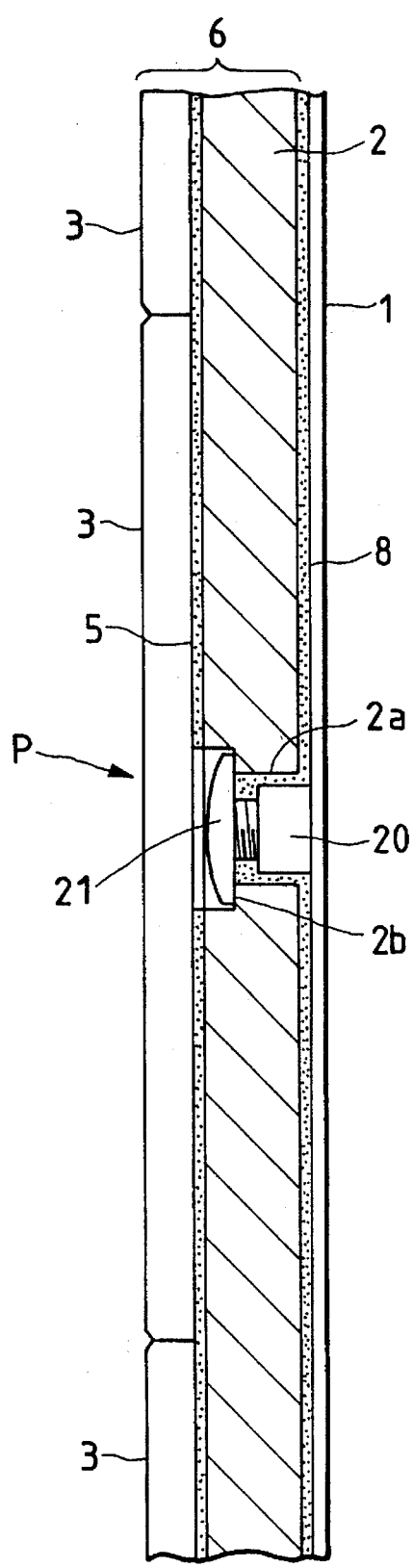
FIG. 8 is a side cross-sectional view of the wall portion of an anechoic chamber in accordance with a second embodiment of the present invention.

FIG. 8 shows a second embodiment of the present invention. In this drawing, nuts 20 which are metal fittings are secured (by welding or brazing) onto the electromagnetic shielding metal plates 1 attached to the entire interior surfaces of the outer-shell structure, by a stud welding machine in the same was as in the first embodiment. Then, the wave absorber panel 6, in which the ferrite tiles 3 are attached to the front surface of the dielectric plate 2 (however, the ferrite tiles 3 are not attached to the portions P for covering the attaching holes 2a and the recesses 2b), is secured to the electromagnetic shielding metal plate 1 by means of screws 21 meshing with the nuts 20 and each having a flat and wide head. At this juncture, the adhesive 8 is provided between the wave absorber panel 6 and the electromagnetic shielding metal plate 1, and bonding is thereby effected simultaneously. After the attachment of the wave absorber panel 6, the ferrite tiles 3 are attached to the portions P as well by means of the adhesive 5. Incidentally, the other arrangements are similar to those of the above-described first embodiment, and it is possible to demonstrate operation and effects similar to those of the first embodiment.

It should be noted that, when the wave absorber panel 6 is attached by the screws 21, it is possible to combine washers and screws to enlarge the area for holding the dielectric plate 2, i.e., plywood, and to adopt flanged screws.

Figure 9:
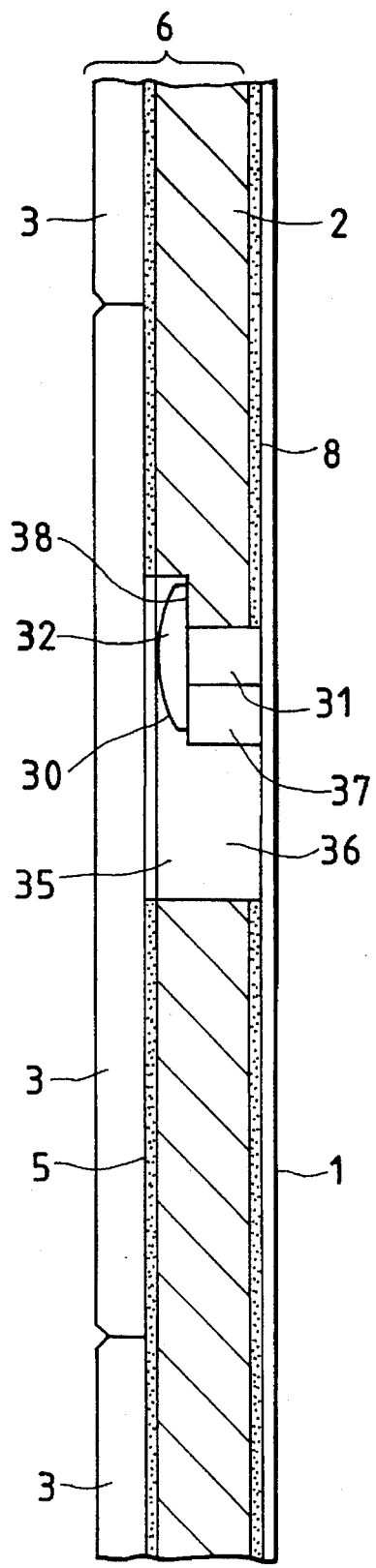
FIG. 9 is a side cross-sectional view of the wall portion of an anechoic chamber in accordance with a third embodiment of the present invention.
Figure 10:
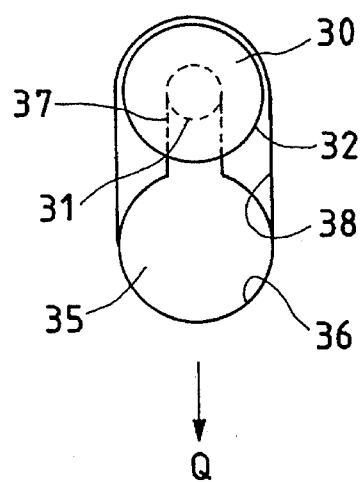
FIG. 10 is a front elevational view illustrating a metal retainer on the electromagnetic shielding metal plate side and an attaching hole on the dielectric plate side.

FIGS. 9 and 10 show a third embodiment of the present invention. In this case, a metal retainer 30 having a flat and wide head 32 at a distal end of its shank 31 is used as the metal fitting. The metal retainers 30 are secured (by welding or brazing) onto the electromagnetic shielding metal plates 1 attached to the entire interior surfaces of the outer-shell structure, by a stud welding machine in the same was as in the first embodiment.

Meanwhile, the wave absorber panel 6 is formed by attaching the ferrite tiles 3 to the front surface of the dielectric plate 2. As shown in FIG. 10, attaching holes 35 are formed in the dielectric plate 2, each attaching hole 35 being comprised of a fitting hole portion 36 larger than the head 32 of the metal retainer 30 and an elongated hole portion 37 continuing from the same and slightly larger than the size of the shank 31. In addition, an elliptical recess 38 having the same width as that of the fitting hole portion 36 is formed around the elongated hole portion 37 so that the head 32 of the metal retainer 30 can be moved along the elongated hole portion 37.

The attachment of the wave absorber panel 6 is executed by fitting the fitting hole portions 36 of the dielectric plate 2 respectively to the heads 32 of the metal retainers 30 welded onto the electromagnetic shielding metal plate 1, and then by sliding the wave absorber panel 6 in parallel to the electromagnetic shielding metal plate 1, as indicated by arrow Q in FIG. 10, until each shank 31 is fitted to the uppermost portion of the elongated hole portion 37 and is retained therein. Consequently, the dielectric plate 2 is reliably pressed at the bottom surfaces of the recesses 38 by the wide heads 32 of the metal retainers 30. At that juncture., if the adhesive 8 is applied between the wave absorber panel 6 and the electromagnetic shielding metal plate 1 and bonding is thereby effected simultaneously, it is possible to prevent the metal retainers 30 from being disengaged from the dielectric plate 2 due to the movement of the wave absorber panel 6. It should be noted that the other arrangements are similar to those of the above-described first embodiment.

In the case of the third embodiment, it is possible to demonstrate operation and effects substantially similar to those of the first embodiment. However, since the operations of threadedly engaging and tightening the screws and the nuts are not required, there is an advantage in that, at a stage prior to the attachment of the wave absorber panel 6, the ferrite tiles 3 can be attached in advance by the adhesive 5 in such a manner as to cover the portions where the attaching holes 35 are provided in the dielectric plate 2.

Although a description has been given of the embodiments of the present invention, the present invention is not limited to the same, and it will be apparent to those skilled in the art that various modifications and changes are possible.

As described above, in accordance with the anechoic chamber of the present invention, in an arrangement in which a dielectric plate is interposed between a metal plate provided on an interior surface of the chamber and a wave absorbing member such that the wave absorbing member is located on an interior-side surface of the chamber, metal fittings are welded or grazed onto the metal plate, and the dielectric plate is attached to the metal plate by means of the metal fittings. Accordingly, it is possible to reliably attach the dielectric plate to the metal plate used as a wave reflector serving also as a shielding material. In addition, since the wave absorbing member, such as a ferrite, is attached in advance to the front surface of the dielectric plate, it is possible to improve the operating efficiency during assembly, thereby reducing the on-site execution time and making skilled operators unnecessary. Furthermore, since the metal fittings are secured onto the metal plate, there occurs no decline in the electromagnetic shielding performance, which becomes a problem when screws are passed through the metal plate.

Referring now to the drawings, a description will be given of another embodiment of the anechoic chamber in accordance with the present invention.

Figure 11:
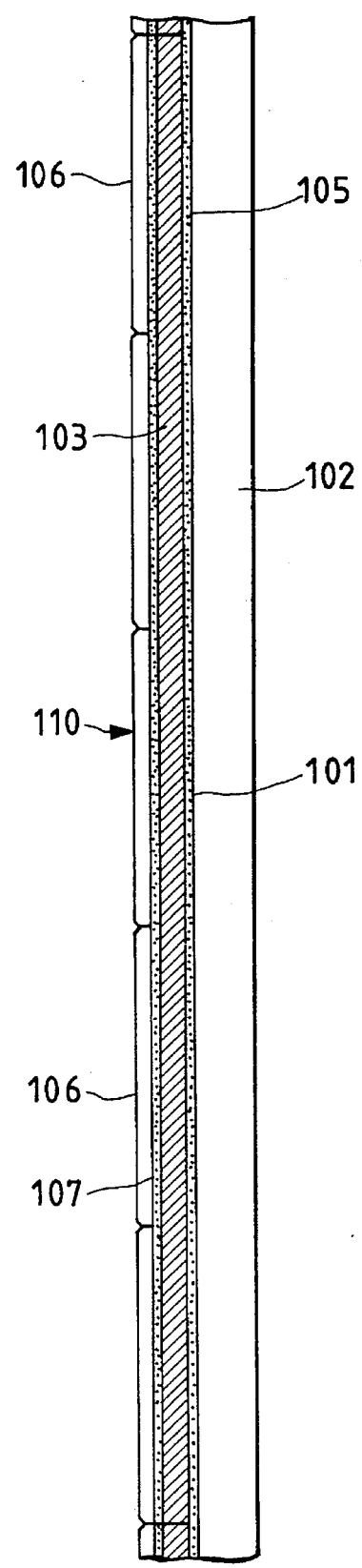
FIG. 11 is a side cross-sectional view illustrating an embodiment of an anechoic chamber in accordance with the present invention.
Figure 12:
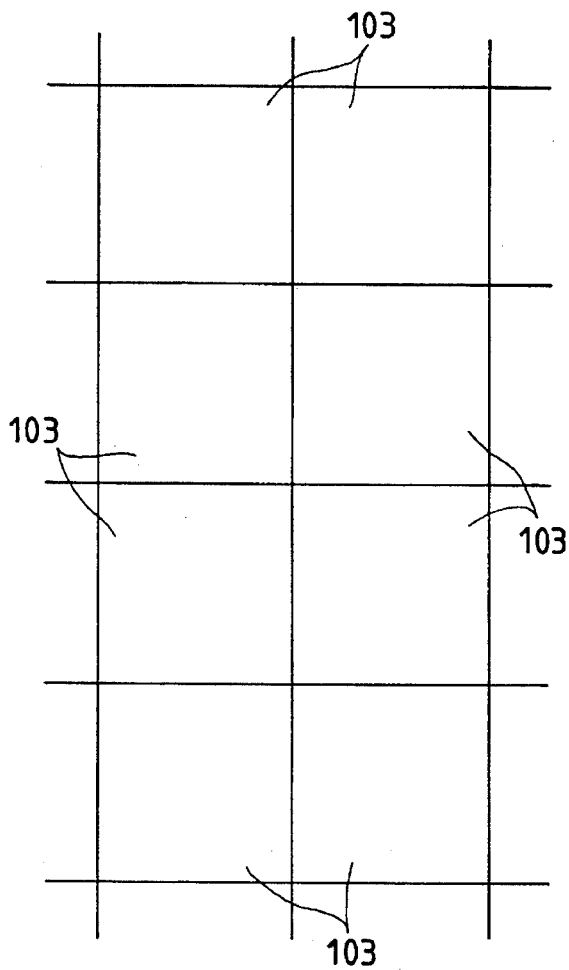
FIG. 12 is a front elevational view, taken from the interior side of the chamber, of a case where dielectric plates whose dimensions are made sufficiently smaller than those of a standard size by dividing a standard-sized dielectric plate are attached.
Figure 13:
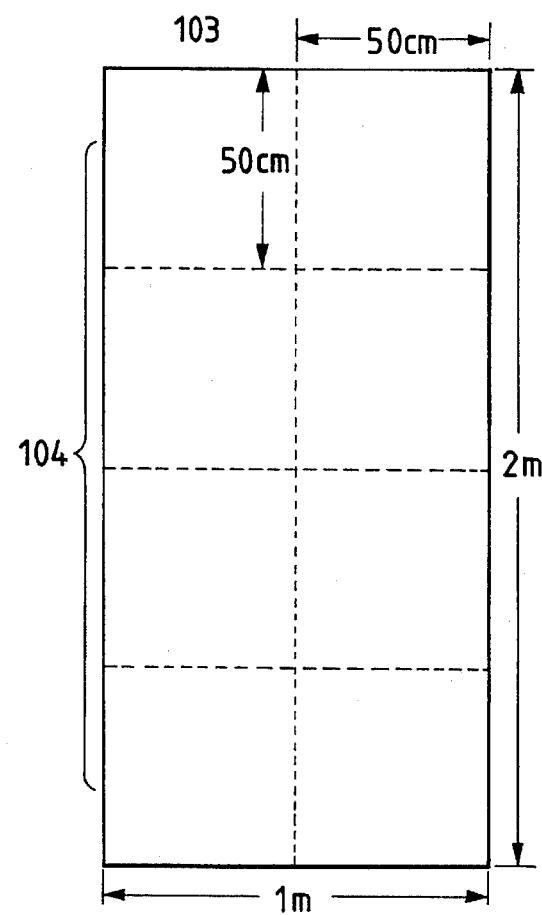
FIG. 13 is a front elevational view illustrating an example in which the standard-sized dielectric plate is divided to obtain the dielectric plates whose dimensions are sufficiently smaller than those of the standard size.
Figure 14:
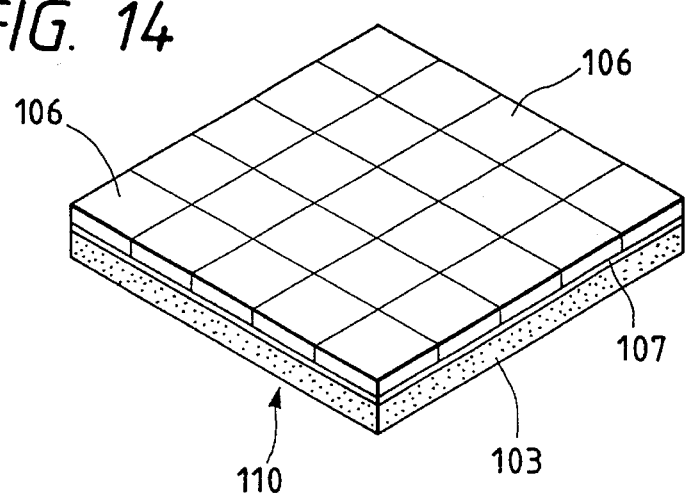
FIG. 14 is a perspective view of a wave absorber panel for an anechoic chamber which is used in the embodiment of the present invention.

FIG. 11 is a cross-sectional view of the anechoic chamber in accordance with the embodiment; FIG. 12 is a front elevational view, taken from the interior side of the chamber, of a case where dielectric plates obtained by dividing a standard-sized dielectric plate are attached to an electromagnetic shielding member; FIG. 13 is a front elevational view illustrating an example in which the standard-sized dielectric plate is divided; and FIG. 14 is a perspective view of a case where a wave absorber panel is formed by attaching in advance ferrite tiles serving as ferrite wave absorbing members to the dielectric plates obtained by dividing the standard-sized dielectric plate.

In these drawings, reference numeral 101 denotes a tinned steel sheet having a thickness of 0.6 mm and serving as an electromagnetic shielding member. This tinned steel sheet 101 is attached to a chamber interior-side surface of waterproof plywood 102 for reinforcement by bonding or the like. A structural member of the anechoic chamber is provided on the rear side of the water-proof plywood 102, and the water-proof plywood 102 is fixed to the structural member. The steel sheet 101 also serves as a wave reflecting plate.

Dielectric plates 103 which are attached to an upper surface of the steel sheet 101 are obtained by cutting, for instance, a dielectric plate (special plywood or the like) 104 of a standard metric size (a transverse dimension of 1000 mm, a longitudinal dimension of 2000 mm, and a thickness of 9 mm), shown in FIG. 13, into 500 mm squares, as indicated by the dotted lines in the drawing. FIG. 12 shows the thus-divided dielectric plates 103, as viewed from the inside of the chamber, in a case where the dielectric plates 103 are attached to the electromagnetic shielding member 101. Since the dielectric plates 103 thus divided have dimensions sufficiently smaller than those of the standard-sized dielectric plate 104, the warping of each dielectric plate 103 is minimized, so that the effect of warping during bonding to the tinned steel sheet 101 by an adhesive can be virtually ignored.

The attachment of the divided dielectric plates 103 to the tinned steel sheet 101 serving as the electromagnetic shielding member can be effected by bonding by using an epoxy resin adhesive 105, as shown in FIG. 11. In this case, after the dielectric plates 103 are secured to the tinned steel sheet 101 by the adhesive 105, ferrite tiles 106 may be attached consecutively to the dielectric plates 103. However, if the operating efficiency of on-site execution of work and the operating time are taken into consideration, it is preferable to form in advance a wave absorber panel 110 in which the ferrite tiles 106 are attached to a chamber interior-side surface of the dielectric plate 103, as shown in FIG. 14, and subsequently secure each wave absorber panel 110 to the tinned steel sheet 101. Therefore, in this embodiment, a description will be given of the case where the wave absorber panel 110 is used.

As shown in FIG. 14, the wave absorber panel 110 is obtained by bonding and fixing the multiplicity of ferrite tiles 106 to the chamber interior-side surface of the dielectric plate 103 formed by cutting the dielectric plate of the standard metric size into 500 mm squares, by using an epoxy resin adhesive 107 for tiles. Here, the ferrite tiles 106 used as ferrite wave absorbing members are made of, for example, an Ni—Zn ferrite or the like having a large magnetic permeability, and are formed into 100 mm squares and a thickness of several millimeters or thereabouts.

The wave absorber panels 110, in each of which the ferrite tiles 106 are thus attached to the front surface of the dielectric plate 103 of 500 mm square, are bonded and fixed to the tinned steel sheet 101 serving as the electromagnetic shielding member by using the epoxy resin adhesive 105 without mutual gaps in the operation at the site, as shown in FIG. 11. Consequently, the ferrite tiles 106 are disposed in such a manner as to be located on a chamber interior-side outermost surface (an outermost surface facing the oncoming waves).

It should be noted that, in FIG. 11, only one side cross section of the anechoic chamber is illustrated, but the tinned steel sheets 11 serving as electromagnetic shielding members are generally disposed in such a manner as to surround the entire interior surfaces of the structure of the anechoic chamber, i.e., the four side surfaces, the ceiling surface, and the floor surface. Hence, the dielectric plates 103 and the ferrite tiles 6 are provided on the chamber-interior side of the tinned steel sheets 101 on at least the four side surfaces and the ceiling surface.

In accordance with this embodiment, since the dielectric plates 103 are used whose dimensions are sufficiently smaller than those of a standard size and which are obtained by cutting and dividing the standard-sized dielectric plate 104, such as special plywood, it is possible to substantially overcome warping which can become a problem in a case where the standard-sized dielectric plate 104 is used as it is.

As illustrated in this embodiment, if the dielectric plates 103 are formed into 500 mm squares, the warping of the dielectric plates 103 can be suppressed to within approximately 3 mm, so that it is possible to prevent the occurrence of faulty bonding, such as the occurrence of portions which cannot be bonded to the dielectric plates 103, thereby making it possible to reliably bond the dielectric plates 103 to the tinned steel sheet 101. In addition, there are advantages in that no wastes are produced when the dielectric plates 103 are fabricated by cutting a dielectric plate of a metric size (1 m ×2 m), and that the cutting of the ferrite tiles 106 is not required when the ferrite tiles 106 are attached in advance to form the wave absorber panel 110. Furthermore, the weight of the wave absorber panel 110 is not more than 20 kg/panel, so that handling at the site is facilitated, and the temporary fixing operation until the curing of the adhesive, which is carried out to obtain an as-designed wave absorbing characteristic by maintaining the uniformity of application of the adhesive, is also facilitated. Thus, although two to three operators are required in the case of panels of a standard size, the operation is made possible even by one operator.

Although, in the above-described embodiment, an example has been shown in which a dielectric plate of a metric size (1000 mm ×2000 mm) is used as the standard-sized dielectric plate serving as a basis for fabricating the dielectric plates 103 smaller than the standard size, a 3×6-feet size (910 mm ×1820 mm) and a 4×8-feet size (1210 mm ×2420 mm) may also be used as the standard-sized dielectric plates. In that case, it suffices if the standard-sized dielectric plate is cut into 600 mm squares or 300 mm squares to fabricate the dielectric plates 103. As for the dimensions of the dielectric plate 103 which is attached to the tinned steel sheet 101, if consideration is given to the facts that it should be able to obtain the dielectric plates 103 without wastes by dividing the standard-sized dielectric plate, that it should be able to attach a multiplicity of the ferrite tiles 106 in advance on the dielectric plate 103 when the wave absorber panel 110 is formed, and that the processing (dividing, cutting, etc.) of the ferrite tiles 106 should not be required when the wave absorber panel 110 is formed, it can be said that desirable dimensions are such that one side of the dielectric plate is a multiple integer of one side of the ferrite tile 106 or slightly smaller than the same, and the dimensions fall in a range of about 300 mm square or about 600 mm square.

In addition, although the 0.6-mm thick tinned steel sheet 101 attached to the water-proof plywood 102 has been shown by way of example as the electromagnetic shielding member, a metal sheet or a metal foil, such as a steel sheet, a copper sheet, or a copper foil, having a thickness of 1 mm to 50μm or thereabouts may be used as the electromagnetic shielding member. If the electromagnetic shielding member is thicker than 1 mm, there is a problem in that workability deteriorates, whereas if the electromagnetic shielding member is thinner than 50μm, the electromagnetic shielding characteristic declines, so that it is not desirable.

Although a description has been given of the embodiment of the present invention, the present invention is not limited to the same, and it will be apparent to those skilled in the art that various modifications and changes are possible within the scope set forth in the claims.

As described above, since the anechoic chamber in accordance with the present invention is arranged such that dimensions of a dielectric plate which is bonded and fixed to an electromagnetic shielding member by an adhesive are made sufficiently smaller than those of a standard size, it is possible to overcome the problem of exfoliation of the standard-sized dielectric plate ascribable to the warping of the dielectric plate when it is bonded to an electromagnetic shielding member, the problem of temporarily fixing and supporting at a multiplicity of points until the curing of the adhesive, which is carried out to obtain an as-designed wave absorbing characteristic by maintaining the uniformity of application of the adhesive, and the problem of handling in terms of the weight in a case where the ferrite wave absorbing members are attached to the dielectric plate to form a wave absorber panel. Consequently, it is possible to enhance the reliability of the bonding of the dielectric plates, improve the operating efficiency during on-site execution of work, make skilled operators unnecessary, and reduce the operating time. In addition, when the dielectric plates are attached to the surface of the electromagnetic shielding member, it becomes possible to effectively attach the dielectric plates only by an adhesive without using metal fittings such as screws, so that there is no risk of undermining the electromagnetic shielding performance.

What is claimed is:

1. An anechoic chamber having a conductively closed structure with a floor, a ceiling and a wall, with at least the inner surface of said ceiling and said wall covered with a wave absorbers which is arranged by interposing a dielectric plate between a metal plate provided on an interior surface of the chamber and a wave absorbing member such that the wave absorbing member is located on an interior-side surface of the chamber, wherein metal fittings are fixed onto said metal plate by one of welding and brazing, and said dielectric plate is attached to said metal plate by means of said metal fittings.

2. An anechoic chamber according to claim 1, wherein an adhesive is used to attach said dielectric plate to said metal plate together with means of said metal fittings.

3. An anechoic chamber according to claim 1, wherein said wave absorbing member is a ferrite tile, and a plurality of said ferrite tiles are attached to a chamber interior-side surface of said dielectric plate so as to form a wave absorber panel.

4. An anechoic chamber according to claim 2, wherein said wave absorbing member is a ferrite tile, and a plurality of said ferrite tiles are attached to a chamber interior-side surface of said dielectric plate so as to form a wave absorber panel.

5. An anechoic chamber according to claim 1, wherein said metal fittings have threaded portions to control a distance between a surface of said dielectric material and a surface of said metal plate.

6. A wave absorber panel which is attached to a metal plate of an anechoic chamber, said wave absorber panel comprising:

a flat dielectric plate of a predetermined thickness having a plurality of through holes, each receiving a metal fitting fixed on the metal plate; and a flat wave absorbing member of a predetermined thickness attached to said dielectric plate.

7. A wave absorber panel according to claim 6, wherein an adhesive is used to attach said dielectric plate to said metal plate together with means of said metal fittings.

8. A wave absorber panel according to claim 6, wherein said wave absorbing member is a ferrite tile, and a plurality of said ferrite tiles are attached to a chamber interior-side surface of said dielectric plate.

9. An anechoic chamber having a conductively closed structure with a floor, a ceiling and a wall, with at least the inner surface of said ceiling and said wall covered with a wave absorber in which an electromagnetic shielding member is used as a wave reflector, a dielectric plate is disposed on the electromagnetic shielding member, and ferrite wave absorbing members are disposed on a chamber interior-side surface of the dielectric plate; and wherein said dielectric plate has a transverse length in a range between 100 to 1000 mm and a transverse width in a range between 100 and 1000 mm, and said dielectric plate is bonded to said electromagnetic shielding member.

10. An anechoic chamber according to claim 9, wherein said ferrite wave absorbing members are attached to the chamber interior-side surface of said dielectric plate.

11. A wave absorber panel which is attached to a electromagnetic shielding member of an anechoic chamber, said wave absorber panel comprising:

a dielectric plate having a transverse length in a range between 100 to 1000 mm and a transverse width in a range between 100 to 1000 mm; and ferrite wave absorbing members are disposed on a chamber interior-side surface of the dielectric plate.

12. A wave absorber panel as claimed in claim 11, wherein said dielectric plate is attached on the electromagnetic shielding member by means of adhesive.

* * * * *